(12) United States Patent
Yaegashi

(10) Patent No.: US 7,642,103 B2
(45) Date of Patent: Jan. 5, 2010

(54) METHOD OF FABRICATING SEMICONDUCTOR DEVICE

(75) Inventor: Tetsuo Yaegashi, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 37 days.

(21) Appl. No.: 12/213,908

(22) Filed: Jun. 26, 2008

(65) Prior Publication Data

US 2008/0274568 A1 Nov. 6, 2008

Related U.S. Application Data

(62) Division of application No. 11/066,154, filed on Feb. 28, 2005, now Pat. No. 7,405,025.

(30) Foreign Application Priority Data

Nov. 29, 2004 (JP) ............................. 2004-344474

(51) Int. Cl.
*H01L 21/66* (2006.01)
(52) U.S. Cl. .................. 438/16; 438/462; 257/E21.53; 430/311
(58) Field of Classification Search .................. 438/14, 438/16, 462; 257/E21.53; 430/311
See application file for complete search history.

(56) References Cited

U.S. PATENT DOCUMENTS

| 5,868,560 | A | 2/1999 | Tamada et al. |
|---|---|---|---|
| 6,093,511 | A | 7/2000 | Tanaka et al. |
| 6,569,584 | B1 | 5/2003 | Ho et al. |
| 6,773,939 | B1 * | 8/2004 | Wright .......... 438/16 |
| 7,273,761 | B2 * | 9/2007 | Rumsey et al. ........ 438/14 |
| 7,476,856 | B2 * | 1/2009 | Watanabe et al. .......... 250/310 |
| 2003/0215965 | A1 * | 11/2003 | Grodnensky et al. ......... 438/16 |
| 2005/0095509 | A1 | 5/2005 | Zhang et al. |
| 2008/0128924 | A1 * | 6/2008 | Liu et al. ................. 257/797 |

OTHER PUBLICATIONS

Patent Abstracts of Japan, Publication No. 08148490 A, published on Jun. 7, 1996.
Patent Abstracts of Japan, Publication No. 05333526 A, published on Dec. 17, 1993.
Patent Abstracts of Japan, Publication No. 59055029 A, published on Mar. 29, 1984.

* cited by examiner

*Primary Examiner*—Tuan N. Quach
(74) *Attorney, Agent, or Firm*—Westerman, Hattori, Daniels & Adrian, LLP

(57) ABSTRACT

Dicing lines extending longitudinally and transversely, and chip areas surrounded by the dicing lines are formed in a resist mask. Critical-dimension patterns are formed in the dicing lines so as to be paired while placing the center line thereof in between. The dimensional measurement of the resist film having these patterns formed therein is made under a CD-SEM, by specifying a measurement-target chip area out of a plurality of chip areas, and by specifying a position of a critical-dimension pattern on the left thereof. Then, the distance of two linear portions configuring the critical-dimension pattern is measured, wherein a portion at a point of measurement on the measurement-target chip area side as viewed from the center line of the dicing line is measured.

8 Claims, 6 Drawing Sheets

METHOD OF FABRICATING SEMICONDUCTOR DEVICE

CROSS-REFERENCE TO RELATED APPLICATIONS

This application is a divisional of application Ser. No. 11/066,154, filed Feb. 28, 2005, now U.S. Pat. No. 7,405,025 which is based upon and claims the benefit of priority from the prior Japanese Patent Application No. 2004-344474, filed on Nov. 29, 2004, the entire contents of which are incorporated herein by reference.

BACKGROUND OF THE INVENTION

1. Field of the Invention

The present invention relates to a reticle and a method of fabricating a semiconductor device suitable for verification of process accuracy and so forth.

2. Description of the Related Art

Any pattern transferred to a resist film using a reticle has been subjected to dimensional measurement for the purpose of confirming the accuracy. The measurement is made on a critical-dimension pattern dedicated for the measurement, previously transferred to the resist film, rather than on patterns configuring circuits for the practical use. It has been becoming more often to form the critical-dimension pattern on the dicing line.

FIG. 8 shows a schematic drawing of a conventional reticle. A reticle 101 is partitioned into a circuit area 102 having patterns configuring circuits for actual use formed therein, and a dicing area 103 provided therearound. The dicing area 103 has a critical-dimension pattern 104, but no circuit patterns, formed therein. The critical-dimension pattern 104 is formed in the center portion of the dicing area 103.

Twice or more number of times of transfer of the pattern onto the resist film formed on a wafer through such reticle 101, and successive development result in formation of dicing lines 112 extending longitudinally and transversely, and chip areas 111 surrounded by the dicing lines 112, as shown in FIG. 9. On the center line of the dicing lines 112, there are formed critical-dimension patterns 113 having a symmetric geometry. The area surrounded by a two-dot chain line in FIG. 9 corresponds to an area transferred by a single shot of light exposure. Two critical-dimension patterns 113 may seem to reside in this area, but it is to be noted that the critical-dimension pattern 113 on the right hand side is one transferred by another shot of light exposure.

When the resist film after the transfer and development is subjected to the dimensional measurement under a CD-SEM (critical dimension scanning electron microscope), one measurement-target chip area 111a out of a plurality of chip areas 111 is specified as shown in FIG. 10, and the position of the critical-dimension pattern 113 which resides on the left is specified. Distance between two linear portions configuring the critical-dimension pattern 113 is then measured. It is necessary herein in the measurement to measure the distance at a measurement point 114a on the measurement-target chip area 111a side, as viewed from the center line of the dicing line 112. This is because the measurement otherwise made at a measurement point 114b on the adjacent chip area 111b, which resides on the opposite side of the measurement-target chip area 111a on the basis of the critical-dimension pattern 113, may raise a confusion such that the CD-SEM displays a state of the dimensional measurement as if it is made on the adjacent chip area 111b, despite the actual measurement being made appropriately.

It is, however, difficult for the conventional method to discriminate the measurement point 114a on the measurement-target chip area 111a side as viewed from the dicing line 112, from the measurement point 114b on the adjacent chip area 111b side, so that the measurement may be made on the distance at the measurement point 114b by mistake.

Similar problems occur not only for the case where one chip is exposed by a single shot of light exposure, but also for the case where a plurality of chips are exposed by a single shot of light exposure.

Related arts are disclosed in Japanese Patent Application Laid-open No. Hei 8-148490, Japanese Patent Application Laid-open No. Hei 5-333526, and Japanese Patent Application Laid-open No. Sho 59-55029.

SUMMARY OF THE INVENTION

It is therefore an object of the present invention to provide a reticle and a method of fabricating a semiconductor device, both of which being capable of precisely specifying a desired position of the pattern during the measurement.

After extensive investigations in pursuit of solutions for the above-described problems, the present inventor has conceived several embodiments of the present invention described below.

A reticle according to the present invention comprises a circuit area having a circuit-configuring pattern, and a dicing area provided around the circuit area corresponding to a dicing line. The dicing area has a critical-dimension pattern inside the center line thereof.

In a method of fabricating a semiconductor device according to the present invention, after a circuit pattern and a critical-dimension pattern are transferred within a chip area and within a dicing line, respectively, a dimension of a critical-dimension pattern transferred by the same shot of light exposure with a measurement-target chip area. As the critical-dimension pattern, one being transferred having, as viewed from the center line of the dicing line, a portion on the same side with a chip area transferred by the same shot of light exposure, separated from another portion which resides on the opposite side.

DETAILED DESCRIPTION OF THE PREFERRED EMBODIMENTS

Figure 1:
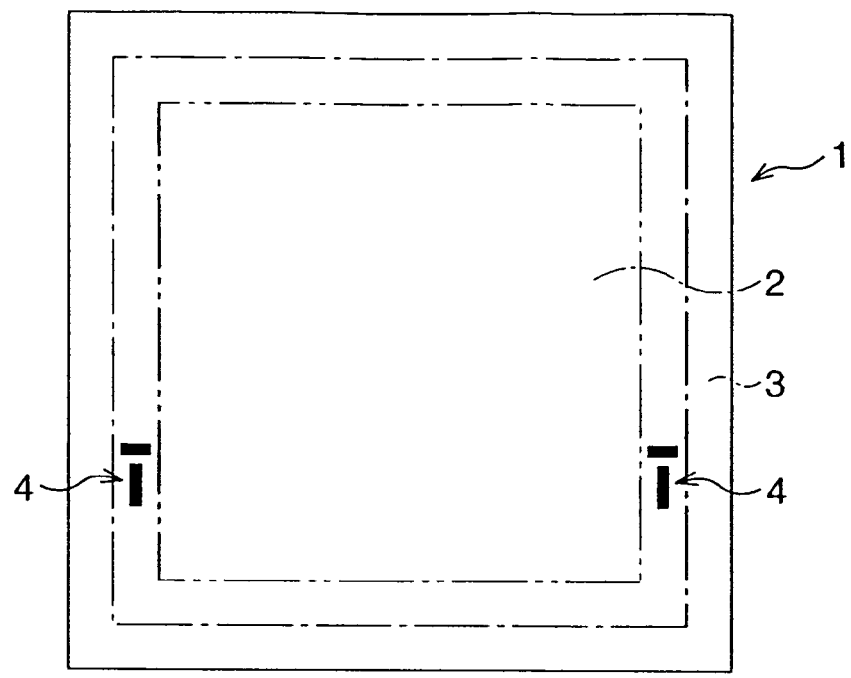
FIG. 1 is a drawing of a reticle according to an embodiment of the present invention.

The following paragraphs will specifically explain embodiments of the present invention referring to the attached drawings. FIG. 1 is a schematic drawing showing a reticle according an embodiment of the present invention.

A reticle 1 according to the present embodiment is divided into a circuit area 2 having an actual-circuit-configuring pattern formed therein, and a dicing area 3 provided therearound. The dicing area 3 has no circuit pattern, but has critical-dimension patterns 4 formed therein. The critical-dimension patterns 4 are formed on the circuit area 2 side as viewed from the center line of the dicing area 3. The critical-dimension patterns 4 has two linear portions separated from each other, for example. These linear portions extend in the directions orthogonal to each other. The critical-dimension patterns 4 are formed at two points in the dicing area 3, while placing the circuit area 2 in between.

Figure 2:
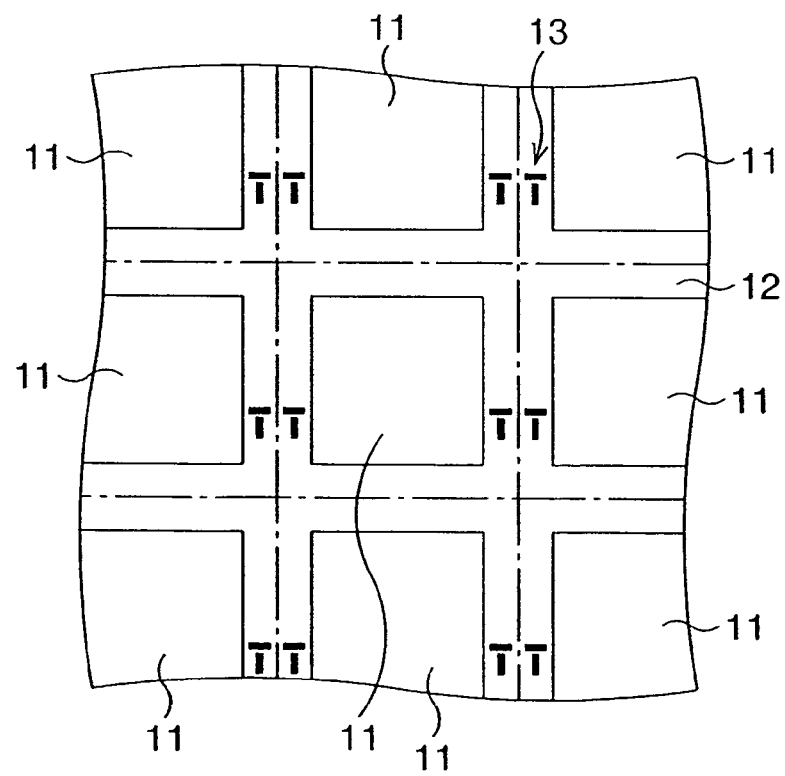
FIG. 2 is a drawing of patterns to be transferred to a resist film.

Light exposure of a resist film formed on a wafer through the reticle 1 makes a pattern (not shown) for the circuit area 2 and the critical-dimension patterns 4 transferred to the resist film. The patterns described in the above can be transferred over the entire portion of the wafer, by shifting the position of the wafer by one chip for every shot of light exposure. The succeeding development makes the transferred patterns remained or removed, and makes the other portion removed or remained, depending on the positive or negative property of the resist film. Dicing lines 12 extending longitudinally and transversely, and chip areas 11 surrounded by the dicing lines 12 are thus formed in the resist film as shown in FIG. 2. In the dicing lines 12, there are formed critical-dimension patterns 13 so as to be paired while placing the center line in between.

Figure 3:
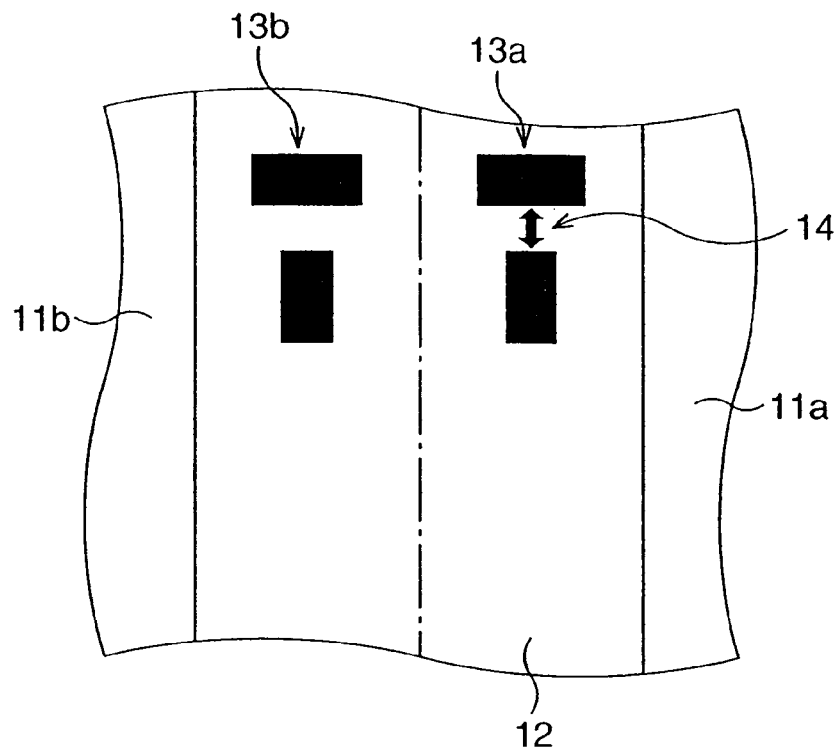
FIG. 3 is a drawing showing a method of dimensional measurement in the embodiment of the present invention.

In the dimensional measurement of the resist film having these patterns formed therein using a CD-SEM, a measurement-target chip area 11a is specified, as shown in FIG. 3, out of a plurality of chip areas 11, and a position of a critical-dimension pattern 13a on the left thereof is specified. Distance of two linear portions configuring the critical-dimension pattern 13a is measured. As described in the above, it is necessary herein to measure a portion at a measurement point 14 on the measurement-target chip area 11a side as viewed from the center line of the dicing line 12.

The critical-dimension pattern 13a placed on the measurement-target chip area 11a side as viewed from the center line of the dicing line 12 and the critical-dimension pattern 13b placed on the adjacent chip area 11b side are separated from each other in the present embodiment, so that it is made possible to exactly specify the position of the critical-dimension pattern 13a, rather than that of the critical-dimension pattern 13b, and to measure the distance at the measurement point 14, unlike the conventional technique. This consequently makes it possible to ensure consistency between the chip area 11 which appears, as a current target for the dimensional measurement, on a display of the CD-SEM, and a critical-dimension pattern 13 under current dimensional measurement. This is successful in avoiding any confusion.

Transfer of two critical-dimension patterns 13 by a single shot of light exposure so as to place the chip area 11 in between makes it possible to readily understand general mis-alignment and so forth possibly occurs in the light exposure.

Figure 4:
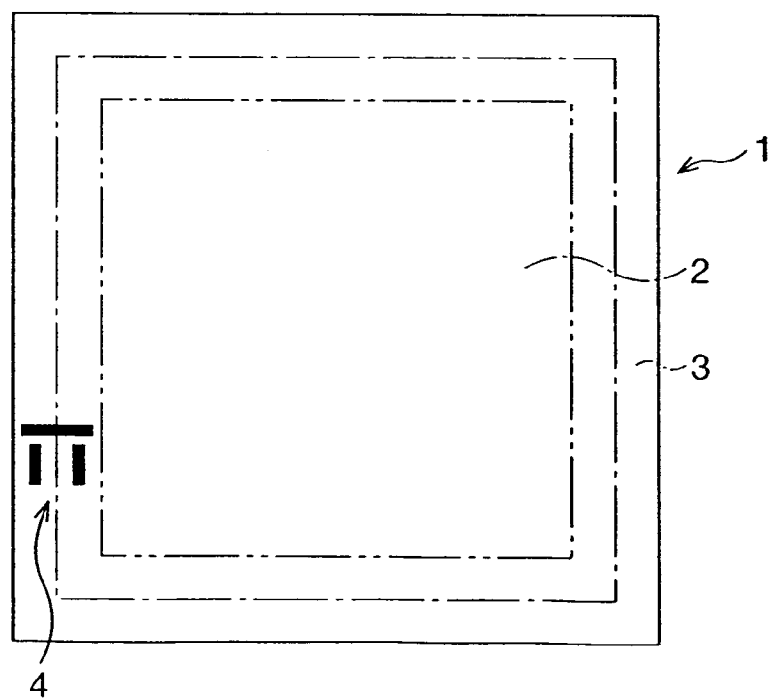
FIG. 4 is a drawing of another example of the reticle.

It is to be noted that the geometry of the critical-dimension pattern 4 provided to the reticle is by no means limited to that shown in FIG. 1. For example, the critical-dimension pattern 4 may be provided as shown in FIG. 4, as having a single linear portion which intersects the center line of the dicing area 3 and two linear portions which extend in parallel with the center line on both sides of the center line. In this case, the critical-dimension patterns 4 are formed asymmetrically on the left and right sides of the circuit area 2 so as to avoid overlapping of the critical-dimension patterns between the adjacent chip areas during the pattern transfer. One preferable case has only a single critical-dimension pattern 4 formed only on the left of the circuit area 2.

Figure 5:
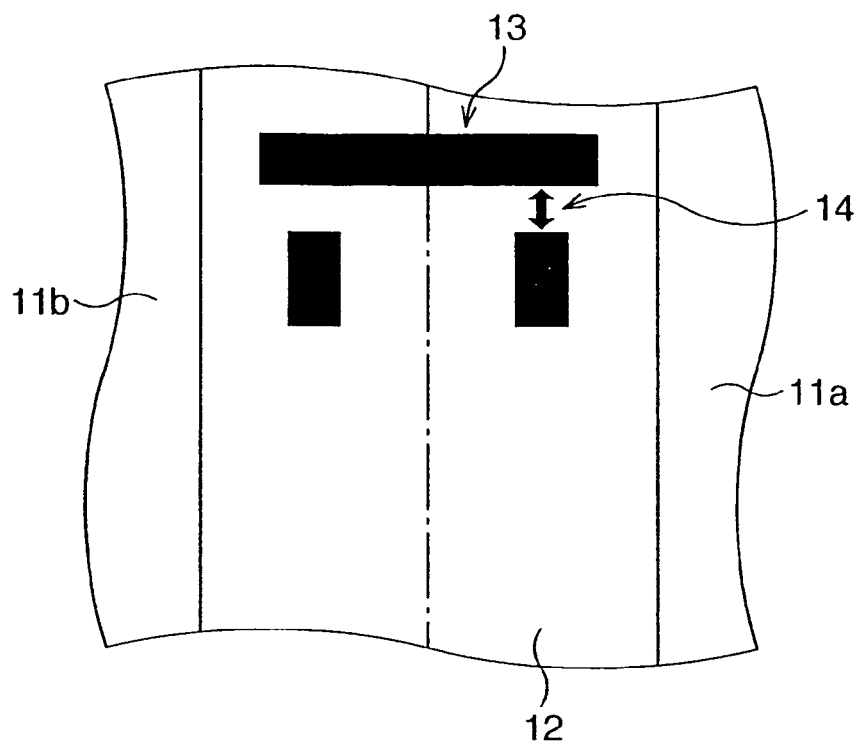
FIG. 5 is a drawing of a pattern transferred through the reticle shown in FIG. 4.

The critical-dimension pattern 13 formed in the resist film through the reticle 1 is such as shown in FIG. 5. That is, the critical-dimension pattern 13 obtained herein consists of a single linear portion which intersects the center line of the dicing line 12 and two linear portions which extend in parallel with the center line on both sides thereof.

Also in this case, with respect to two linear portions extending in parallel with the center line, the one placed on the measurement-target chip area 11a side as viewed from the center line of the dicing line 12 and the other placed on the adjacent chip area 11b side are separated from each other, so that it is made possible to exactly measure the distance at the measurement point 14. This consequently makes it possible to ensure consistency between the chip area 11 which is, for example, displayed by the CD-SEM as a current target for the dimensional measurement, and a critical-dimension pattern 13 under current dimensional measurement, without causing any confusion.

Figure 6:
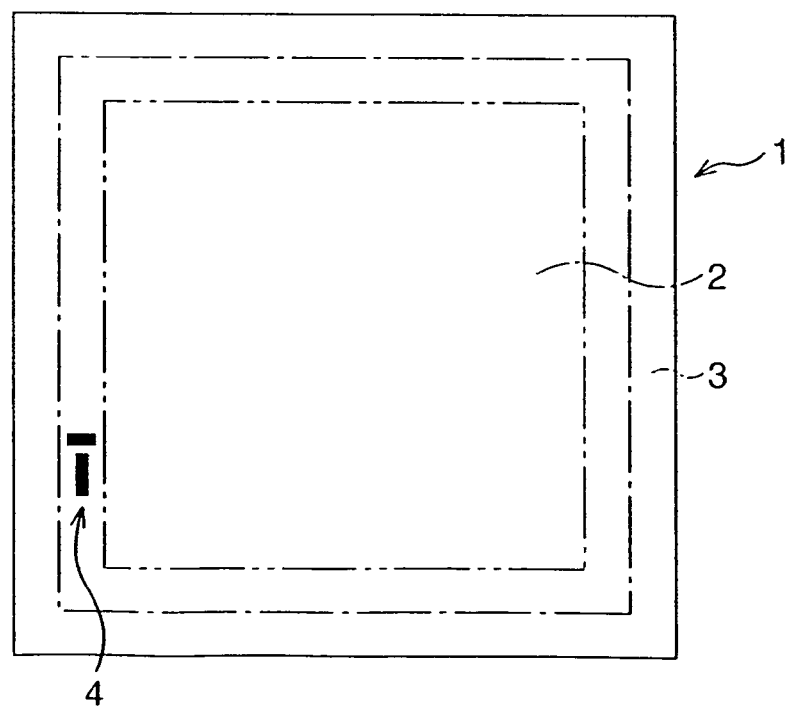
FIG. 6 is a drawing of still another example of the reticle.
Figure 7:
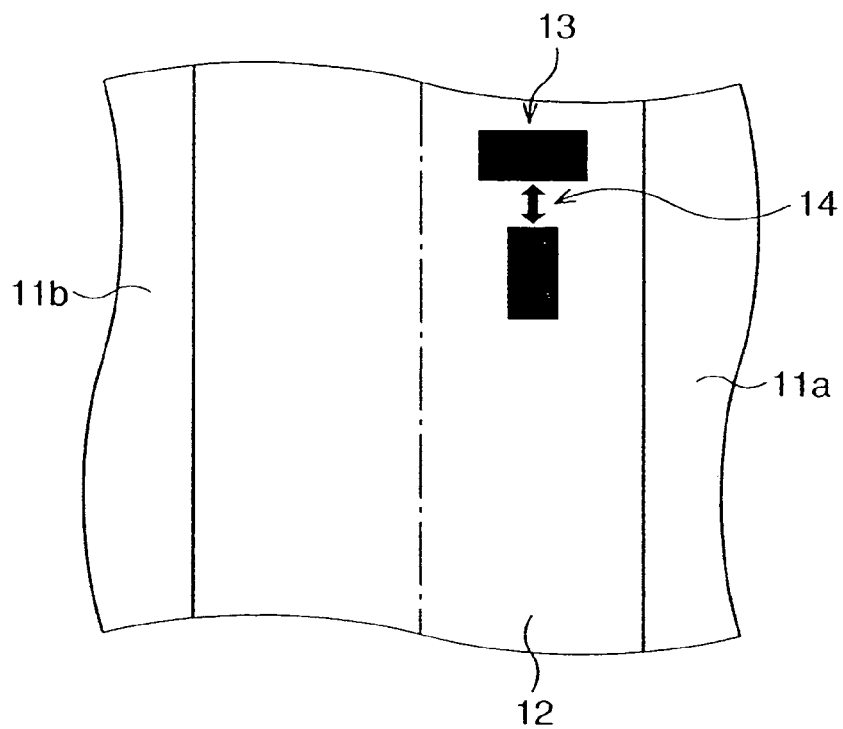
FIG. 7 is a drawing of a pattern transferred through the reticle shown in FIG. 6.
Figure 8:
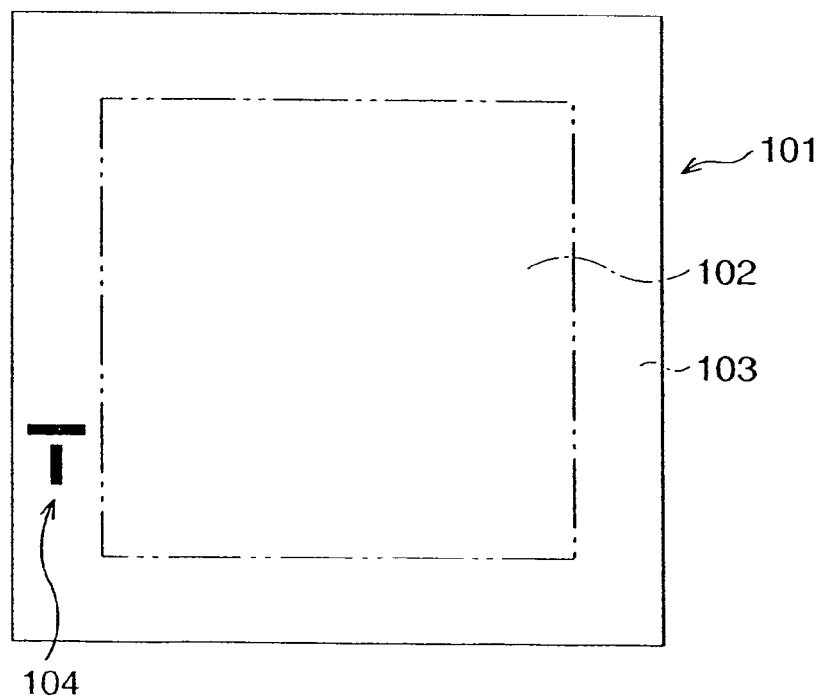
FIG. 8 is a drawing of a conventional reticle.
Figure 9:
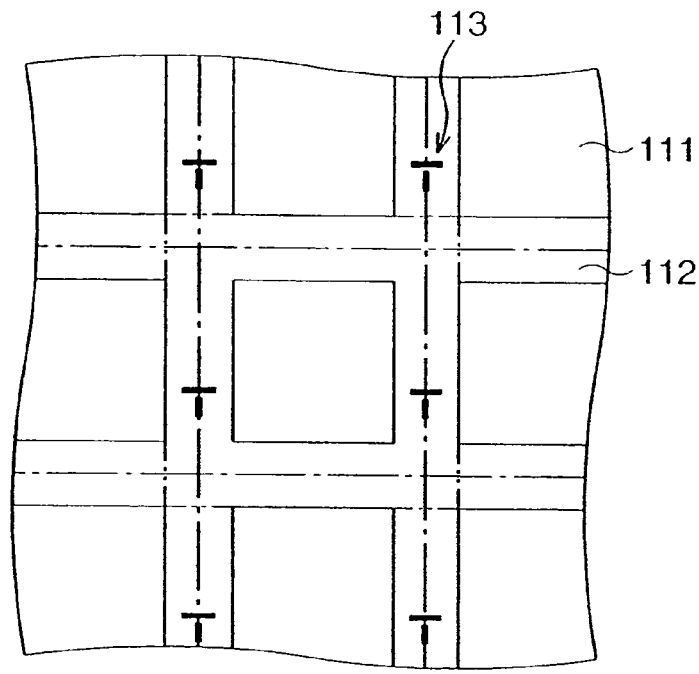
FIG. 9 is a drawing of a pattern obtained by the single-chip-by-single-shot process.
Figure 10:
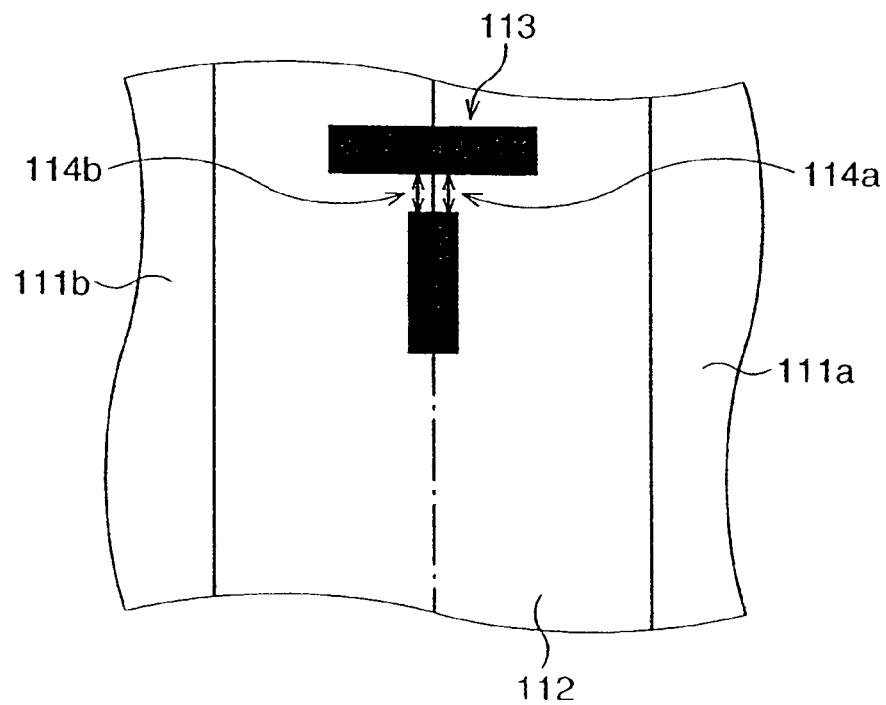
FIG. 10 is a drawing of a critical-dimension pattern transferred to a resist film by a conventional method.
Figure 11:
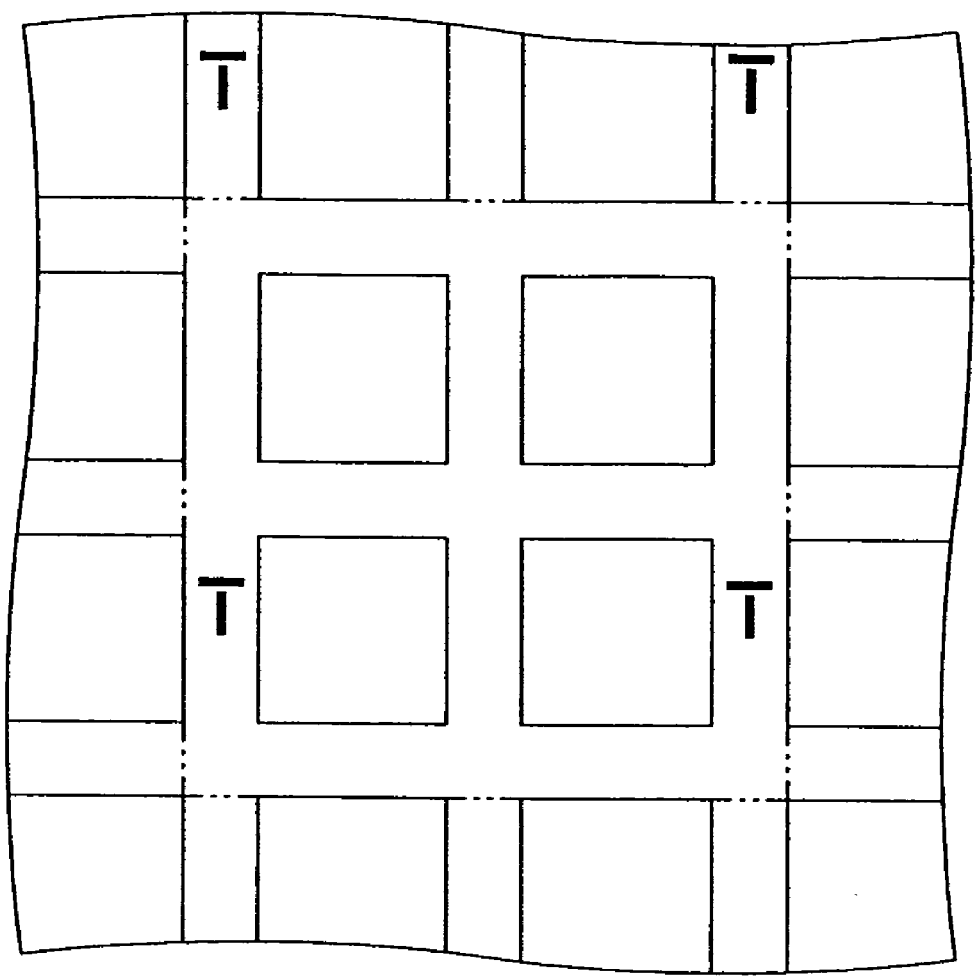
FIG. 11 is a drawing of a pattern obtained by the multiple-chip-by-single-shot process.

It is also allowable, as shown in FIG. 6, to provide the critical-dimension pattern 4 shown in FIG. 1 only on one side of the circuit area 2. In this case, the critical-dimension pattern 13 shown in FIG. 7 is formed in the resist film, and this makes it possible to exactly measure the distance at the measurement point 14, without causing any confusion.

The above description dealt with the case where the dicing area 3 on the reticle 1 is aligned with the dicing line 12 formed in the resist film, so that the pattern formed on the circuit area 2 side as viewed from the center line of the dicing area 3 is transferred on the chip area 11 side, the chip being formed by the same shot of light exposure, as viewed from the center line of the dicing line 12, but those are not essential matters. For example, even the critical-dimension pattern 4 formed beyond the center line of the dicing area 3 makes it possible to exactly measure the distance at the measurement point 14 without causing any confusion between the measurement-target chip area 11a and the adjacent chip area 11b, if the pattern 4 is transferred on the chip area 11 side, the chip area 11 being formed by the same shot of light exposure, as viewed from the center line of the dicing line 12, and if the desired measurement point 14 is separated from the measurement point which resides on the adjacent chip area side.

The critical-dimension pattern 4 formed on the reticle 1 may be either of a removed pattern or remained pattern, depending on the positive or negative property of the resist film.

It is still also allowable to directly form the critical-dimension pattern 13 in the resist film typically by electron beam lithography, without using the reticle 1.

The present invention makes it possible to exactly carry out the measurement of the critical-dimension pattern at a desired position. This is successful in avoiding unnecessary confusion even when the dimensional measurement is made under a CD-SEM.

What is claimed is:

1. A method of fabricating a semiconductor device comprising the steps of:

transferring a circuit pattern within chip areas, and transferring a critical-dimension pattern within a dicing line; and measuring a dimension of a critical-dimension pattern transferred by the same shot of light exposure with a measurement-target chip area, as the critical-dimension pattern, one being transferred having, as viewed from the center line of the dicing line, a portion on the same side with a chip area transferred by the same shot of light exposure, separated from another portion which resides on the opposite side.

2. The method of fabricating a semiconductor device according to claim 1, wherein the critical-dimension patterns are measured under a critical-dimension scanning electron microscope.

3. The method of fabricating a semiconductor device according to claim 1, wherein as the critical-dimension pattern, one is transferred having at least two linear portions arranged so as to be spaced from each other.

4. The method of fabricating a semiconductor device according to claim 1, wherein the critical-dimension patterns are transferred in at least two points by a single shot of light exposure within the dicing line.

5. The method of fabricating a semiconductor device according to claim 4, wherein the critical-dimension patterns are formed in two points placing the circuit area in between.

6. The method of fabricating a semiconductor device according to claim 1, wherein said step of measuring the critical-dimension pattern comprises the steps of:

specifying a position of the critical-dimension pattern on the basis of the center line of the dicing line; and measuring a portion of the critical-dimension pattern, as viewed from the center line of the dicing line, on the same side with the chip area.

7. The method of fabricating a semiconductor device according to claim 1, wherein, as the critical-dimension pattern, one is transferred having:

a first linear portion formed, as viewed from the center line of the dicing line, on the same side with the chip areas transferred by the same shot of light exposure, and extending in parallel with the center line; and a second linear portion spaced from the first linear portion, and extending in the direction normal to said center line.

8. The method of fabricating a semiconductor device according to claim 1, further comprising a step of displaying results of the measurement on a display, together with a measurement-target chip area.

\* \* \* \* \*